United States Patent [19]

Okada et al.

[11] Patent Number: 5,407,870
[45] Date of Patent: Apr. 18, 1995

[54] PROCESS FOR FABRICATING A SEMICONDUCTOR DEVICE HAVING A HIGH RELIABILITY DIELECTRIC MATERIAL

[75] Inventors: Yoshio Okada; Philip J. Tobin, both of Austin, Tex.

[73] Assignee: Motorola Inc., Schaumburg, Ill.

[21] Appl. No.: 71,885

[22] Filed: Jun. 7, 1993

[51] Int. Cl.$^6$ .......................................... H01L 21/285
[52] U.S. Cl. .................... 437/241; 435/242; 435/42; 435/43; 257/411
[58] Field of Search ............... 437/241, 920, 239, 242, 437/42, 43, 978, 235; 148/DIG. 156, DIG. 112, DIG. 114; 257/411

[56] References Cited

U.S. PATENT DOCUMENTS

| | | | |
|---|---|---|---|
| 5,198,392 | 3/1993 | Fukuda et al. | 148/DIG. 112 |
| 5,225,361 | 7/1993 | Kakiuchi et al. | 437/43 |
| 5,254,506 | 10/1993 | Hori | 148/DIG. 114 |
| 5,258,333 | 11/1993 | Shappir et al. | 437/241 |
| 5,278,087 | 1/1994 | Jenq | 437/43 |

FOREIGN PATENT DOCUMENTS

| | | | |
|---|---|---|---|
| 60-189972 | 9/1985 | Japan | 437/42 |
| 62-122222 | 3/1987 | Japan | 437/241 |

OTHER PUBLICATIONS

Yoon, et al., "MOS Characteristics of NH3-Nitrided N2O-Grown Oxides," IEEE Electron Dev. Letters, (14), No. 4, pp. 179-181 (Apr. 1993).

Ohnishi, et al., "Ultrathin Oxide/Nitride/Oxide/Nitride Multilayer Films for Mbit DRAM Capacitors," Solid State Devices & Materials Ext. Abstracts of '92 Int. Conf., pp. 67-69 (1992).

Haddad, et al., "Improvement of Thin-Gate Oxide Integrity Using Through-Silicon-Gate Nitrogen Ion Implantation," IEEE Electron Dev. Letters, vol. EDL-8 No. 2, pp. 58-60 (1987).

Ahn, et al., "Furnace Nitridation of Thermal SiO2 in Pure N2O Ambient for ULSI MOS Applications," IEEE Electron Device Letters, vol. 13, No. 2, pp. 117-119 (Feb. 1992).

Lo, et al., "Improved Hot-Carrier Immunity in CMOS Analog Device with N2O-Nitrided Gate Oxides" IEEE Electron Dev. Letters, vol. 13, NO. 11, pp. 457-459 (Sep. 8, 1992).

Fukuda, et al., "High-Performance Scaled Flash-Type EEPROMs with Heavily Oxynitrided Tunnel Oxide Films," IEDM, pp. 465-468 (1992).

Lo, et al., "Improved Performance and Reliability of MOSFETs with Ultrathin Gate Oxides . . . ," Symposium on VLSI Technology, pp. 43-44 (1991).

Anonymous (R1788), "Under-grown multiple dielectric-layer semiconductor device," Research Disclosure 18756, Derwent Publications, Nov., 1979.

Primary Examiner—Olik Chaudhuri
Assistant Examiner—S. Mulpuri
Attorney, Agent, or Firm—Jasper W. Dockrey

[57] ABSTRACT

A process for fabricating a high-reliability composite dielectric layer (19) includes the formation of a first oxynitride layer (14) on the surface (12) of a silicon substrate (10). The formation of the first oxynitride layer (14) is followed by an oxidation step to form a silicon dioxide layer (16) at the surface (12) of the substrate (10) and underlying the first oxynitride layer (14). The composite dielectric layer (19) is completed by exposing the substrate (10) to nitrous oxide, and diffusing a nitrogen bearing species through both the silicon dioxide layer (16) and the first oxynitride layer (14) to form a second oxynitride layer (18) underlying the silicon dioxide layer (16). The composite dielectric layer (19) exhibits a nitrogen-rich region at the interface between second oxynitride layer (18) and the silicon substrate (10). A second nitrogen rich region is also formed near the surface of the first oxynitride layer (14).

16 Claims, 3 Drawing Sheets

PROCESS FOR FABRICATING A SEMICONDUCTOR DEVICE HAVING A HIGH RELIABILITY DIELECTRIC MATERIAL

FIELD OF THE INVENTION

This invention relates in general to a method for fabricating a semiconductor device, and more particularly, to a method for high-reliability dielectric material for a semiconductor device.

BACKGROUND OF THE INVENTION

In the fabrication of a metal-oxide-semiconductor (MOS) device, the gate integrity of the dielectric material is a key factor in determining the long term reliability characteristics of the device. In an MOS transistor, the gate dielectric material must support a substantial voltage difference between the gate electrode and the semiconductor substrate. The gate dielectric material must also maintain its ability to support the voltage difference between the gate and the substrate, while being subjected to the electron and hole injection from both the gate electrode and the substrate. In the case of very-large-scale-integration (VLSI) devices, the effective gate lengths are on the order of less than 1 micron. At such small effective gate lengths, electrons can be injected into the dielectric layer during periods when the transistor in switched on and off. The injection of electrons into the dielectric material can, over time, cause a shift in the threshold voltage of the transistor. Over an extended period of time, a continual shift in the threshold voltage eventually results in an inability to switch the transistor on and off. Therefore, it is important in the fabrication of an MOS transistor that a high quality dielectric material be provided in order to insure long term reliability of the transistor.

A similar need for a high reliability dielectric material is realized in the fabrication of electrically-erasable-programmable-read-only memories (EEPROMs). An EEPROM cell varies charge stored on a floating gate in order to vary the threshold voltage, $V_T$, of a floating gate type MOS transistor. In the case of a FETMOS EEPROM device, the device is said to be "programmed" when the $V_T$ of the transistor is less than some predetermined switch point voltage, $V_{TSP}$. Correspondingly, the device is said to be "erased" when the $V_T$ of the device is greater than $V_{TSP}$. Typically, $V_{TSP}$ is chosen to be less than the positive supply voltage $V_{DD}$ in static memory arrays, and is approximately equal to $V_{DD}$ in dynamic memory arrays. Making the charge stored on the floating gate more positive decreases the $V_T$ of the transistor, and making the charge stored on the floating gate more negative increases $V_T$ of the transistor. Charge is added to or removed from the floating gate by Fowler-Nordheim tunneling, channel hot carrier injection, or other techniques.

The ability to perform programming and erasing of an EEPROM device depends on the maintenance of a threshold voltage difference as the charge on the floating gate is changed from positive to negative. An EEPROM device which relies on electron tunneling for programming and erasing is known in the art as a floating-gate electron tunneling MOS (FETMOS) EEPROM. Typically, a region in the dielectric material underlying the floating gate is especially fabricated for the purposes of electron tunneling between the floating gate and the substrate. The dielectric layer through which the electron tunneling occurs, must, necessarily, be very robust to insure the long term programmability of the EEPROM device.

In the search for more robust dielectric materials, researchers have turned to oxynitride materials. Oxynitrides have demonstrated excellent endurance to electron and hole injection over prolonged periods of time. The endurance of oxynitride is thought to be related to the accumulation of nitrogen near the silicon-silicon dioxide ($Si/SiO_2$) interface.

Several techniques have been developed for the formation of an oxynitride dielectric material. In one method, silicon dioxide is formed by thermal oxidation of a silicon substrate. Then, a polysilicon layer is deposited to overlie the silicon dioxide layer, and implanted with nitrogen. Next, an anneal step is used to drive the nitrogen from the polysilicon layer to produce increased concentrations of nitrogen at the silicon dioxide interfaces ("Improvement of Thin-Gate Oxide Integrity Using Through-silicon-Gate Nitrogen Ion Implantation," S. Haddad, et al., IEEE, Electron Dev. Letters, (EDL-8), 2, 1987, pp. 58–60). In another method, ammonia is used to increase the interfacial nitrogen concentration in a previously formed oxynitride layer ("MOS Characteristics of $NH_3$-Nitrided $N2O$-Grown Oxides," G. W. Yoon, et al., IEEE, Electron Dev. Letters (14), 4, 1993, pp. 179–181). In yet another method, oxynitride is formed by subjecting a silicon substrate to rapid thermal annealing in a nitrous oxide ambient ("High-Performance Scaled Flash-Type EEPROMs with Heavily Oxynitrided Tunnel Oxide Films," H. Fukuda, et al., IEEE, IEDM 1992, pp. 465–466). While the foregoing techniques are effective for the formation of an oxynitride material, a nitrogen rich layer is only obtained at a silicon silicon-dioxide interface. To obtain the enhanced dielectric endurance required by VLSI MOS devices, such as MOS transistors and FETMOS EEPROM devices, and the like, further development is necessary to enhance the charge-to-breakdown value of oxynitride dielectric material.

SUMMARY OF THE INVENTION

In practicing the present invention, there is provided a process for fabricating a semiconductor device having a high reliability dielectric material. In accordance with embodiment of the invention, a silicon substrate having a surface is provided. A first oxynitride layer is formed on the substrate, and the substrate is oxidized to form an silicon dioxide layer underlying the first oxynitride layer. Then, the substrate is exposed to nitrous oxide and a nitrogen bearing species is diffused through the oxide layer and the first oxynitride layer to form a second oxynitride layer underlying the silicon dioxide layer.

BRIEF DESCRIPTION OF THE DRAWINGS

FIGS. 6-1 through 6-3 illustrate, in cross-section, process steps in accordance with the invention for fabricating an EEPROM device.

DETAILED DESCRIPTION OF THE PREFERRED EMBODIMENTS

The process of the present invention provides a multi-layered dielectric material having a precisely tailored nitrogen concentration profile therein. The process further provides high nitrogen concentrations in regions of the dielectric material which are adjacent to electrically conductive bodies. By providing a dielectric material having areas of high nitrogen concentration at selected locations, the charge-to-breakdown ($Q_{bd}$) value is improved over dielectric materials of the prior art. A high $Q_{bd}$ value increases the reliability of the dielectric material over extended periods of time.

Figure 1:
FIGS. 1-3 illustrate, in cross-section, process steps in accordance with the invention for the fabrication of a composite dielectric layer.

Shown in FIG. 1, is a portion of a semiconductor substrate 10 having an oxynitride layer 14 ($SiN_xO_y$) thereon. In a preferred embodiment, oxynitride layer 14 is formed in a thermally-controlled reactor. Initially, native oxide is removed from the surface 12 of substrate 10. Then, substrate 10 is heated to a temperature of about 900° to 1500° C., and nitrous oxide ($N_2O$) is introduced into the reactor. In the reactor, a chemical reaction is carried out to form oxynitride layer 14 having a thickness of about 30 angstroms.

The $N_2O$ reaction produces a peak nitrogen concentration in oxynitride layer 14, which is narrowly defined in the central portion of the oxynitride layer. While not wishing to be bound by any particular theory of the invention, the inventors believe that the primary reaction species is nitric oxide (NO), which represents 4 to 10 atomic % of the initial quantity of $N_2O$ introduced into the reactor. However, the nitrogen bearing species, which reacts with silicon to form the oxynitride layer can also be $N_2O$ or $NO_2$.

Following the formation of oxynitride layer 14, an oxidation process is carried out to form a silicon dioxide layer ($SiO_2$) underlying oxynitride layer 14. To form $SiO_2$ layer 16, oxygen is introduced into the reactor, and the oxygen is diffused through oxynitride layer 14 to substrate surface 12. The oxygen atoms react with silicon in substrate 10 to form $SiO_2$ layer 16. As $SiO_2$ layer 16 grows, substrate surface 12 recedes into substrate 10 as silicon atoms at the surface react with oxygen to form $SiO_2$. Following the oxidation process, oxynitride layer 14 overlies $SiO_2$ layer 16, rather than substrate surface 12. Thus, silicon dioxide layer 16 lies intermediate to substrate 10 and oxynitride layer 14. Preferably, $SiO_2$ layer 16 is grown to a thickness of about 35 to 45 angstroms, and most preferably, to a thickness of 40 angstroms. The oxidation process is preferably carried out at a temperature of about 925° to 1150° C., and most preferably at about 950° C. During oxidation, very little of the oxygen diffusing through oxynitride layer 14 reacts with the constituents of oxynitride layer 14. The majority of the oxygen species diffusing through oxynitride layer 14 react with silicon to form $SiO_2$. This is because, the reaction rate constant for the reaction of silicon with oxygen is substantially greater than the corresponding rate constant for the reaction of oxygen with the components of oxynitride layer 14.

Once the oxidation process is complete, a second oxynitride layer 18 is formed at substrate surface 12 below $SiO_2$ layer 16. Preferably, substrate 10 is again placed in a thermally-controlled reactor, and $N_2O$ is provided and NO is diffused through first oxynitride layer 14, and $SiO_2$ layer 16. As in the previous step, the reaction gas molecules diffuse through the layers overlying substrate 10 to react with the silicon at substrate surface 12. In this case, the reaction rate constant for the reaction of NO with silicon, is substantially greater than the corresponding reaction rate constant for the reaction between NO and $SiO_2$. As a result, the NO diffuses through both first oxynitride layer 14 and $SiO_2$ layer 16 without substantially reacting with the constituents of either layer. Once the NO reaches substrate surface 12, the kinetically favored reaction then occurs between NO and the silicon atoms at substrate surface 12. The reaction between NO and silicon forms second oxynitride layer 18. Although the diffused species is believed to be NO, it is within the scope of the invention that another nitrogen-bearing species, such as $N_2O$ or $NO_2$, can be diffused to form second oxynitride layer 18.

First and second oxynitride layers 14 and 18, and $SiO_2$ layer 16 comprise a composite dielectric layer 19. Composite dielectric layer 19 is precisely constructed to contain regions of nitrogen accumulation at the interface between dielectric layer 19 and substrate 10 as well as the upper surface of dielectric layer 19. An important aspect of the present invention includes the ability of dielectric layer 19 to maintain high $Q_{bd}$ values over an extended period of time. The regions of nitrogen accumulation in composite dielectric layer 19 prevent the formation of electron trapping sites near the interfaces of dielectric layer 19. As will subsequently be described, the durability of dielectric layer 19 makes dielectric layer 19 especially useful as a tunnel gate dielectric material for an EEPROM device.

Figure 4:
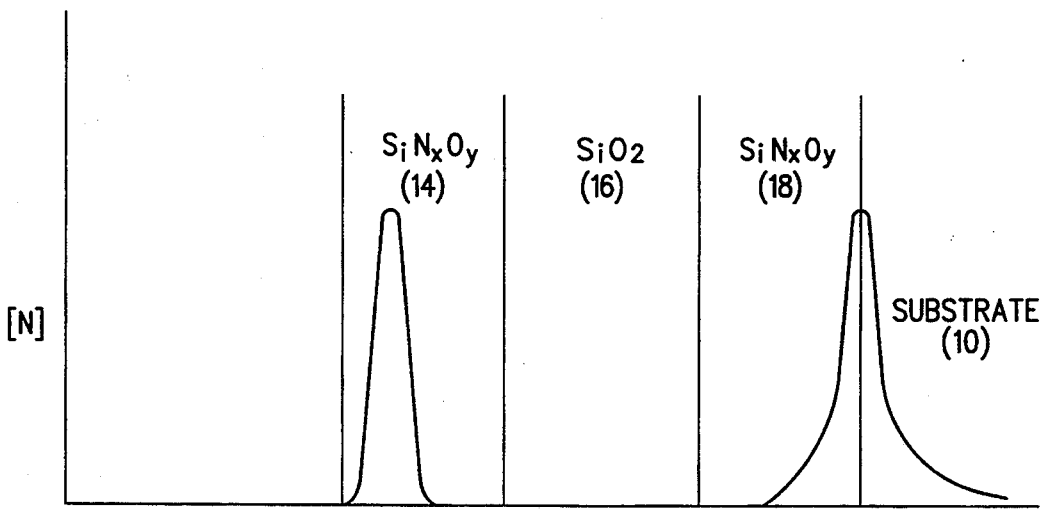
FIG. 4 graphically illustrates the distribution of nitrogen in a composite dielectric material formed in accordance with the invention.

FIG. 4 illustrates, graphically, the nitrogen concentration distribution within the two oxynitride layers, and the intermediate $SiO_2$ layer. The topmost layer, oxynitride layer 14, is characterized by a large nitrogen concentration peak within the oxynitride layer. The peak concentration is displaced toward the upper surface of the oxynitride layer. A second nitrogen concentration peak occurs at the interface between second oxynitride layer 18 and the substrate. Although not wishing to be bound by any particular theory of the invention, the inventors believe that the nitrogen atoms in the nitrous oxide molecule form low energy stable chemical bonds with silicon atoms. The stability of the Si-N bonds prevents the spreading of the nitrogen in first oxynitride layer 14 during the subsequent thermal processes used to form $SiO_2$ layer 16, and second oxynitride layer 18. The stability of the Si-N bonds also accounts for the high nitrogen concentration observed at the interface between the substrate and second oxynitride layer 18.

Figure 5:
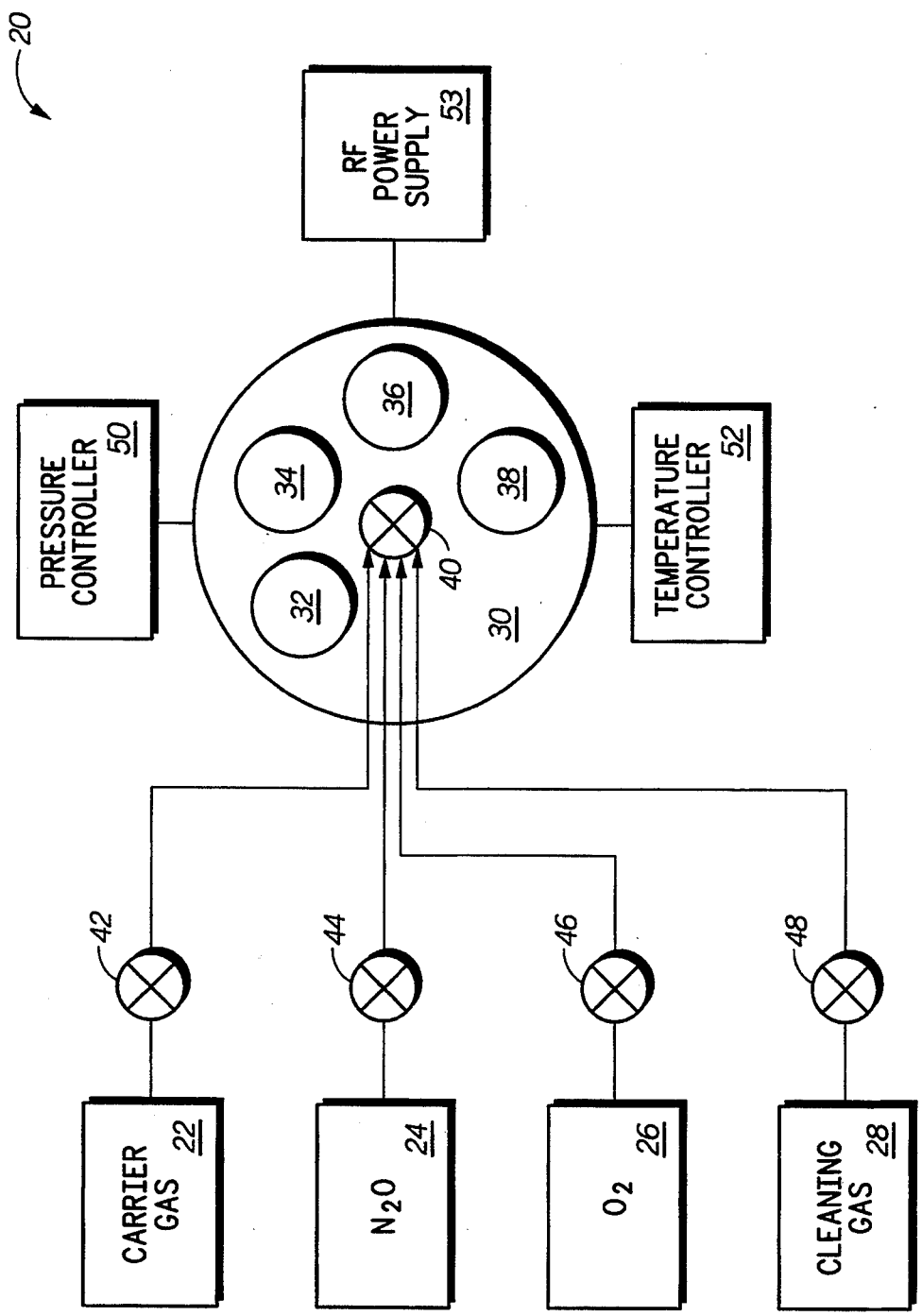
FIG. 5 illustrates a processing apparatus for carrying out the invention.

In one embodiment, the foregoing process steps are completed in an exemplary processing apparatus 20, illustrated in FIG. 5. Processing apparatus 20 includes gas supplies 22, 24, 26, and 28. The gas supplies provide source gases to process housing 30. Process housing 30 contains processing chambers 32, 34, 36, and 38. A main mass flow controller 40 selectively distributes gases which are input from the various gas supply sources to the various process chambers in housing 30. The flow of each source gas is regulated by independent mass flow controllers 42, 44, 46, and 48. The processing pressure within each of the process chambers is independently controlled by pressure controller 50, and the processing temperature in each chamber is independently controlled by temperature controller 52. In addition, an RF power supply 53 provides RF power to selected chambers for plasma etching processes. The multi-chambered configuration of processing apparatus 20, permits independent processing steps to be carried out in each of the individual processing chambers without subjecting the substrate work pieces to room-ambient conditions between processing steps. Substrate transfer means are provided in processing apparatus 20 for the transfer of work pieces between the processing chambers, and to and from process housing 30.

Figure 2:
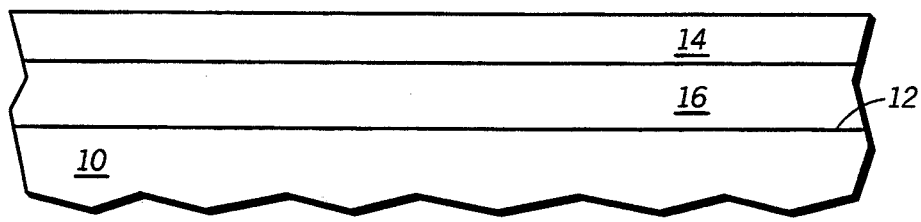

The processing steps illustrated in FIGS. 1-3 can, for example, be carried out in processing apparatus 20 in the following manner. The process begins with the transfer of substrate 10 to process chamber 32. In process chamber 32, cleaning gas is introduced from gas supply 28 through mass flow controller 48 and master valve 40. Substrate surface 12 is processed in chamber 32 to remove all native oxide materials overlying substrate surface 12. This is accomplished, preferably, by introducing hydrogen fluorine gas (HF) into chamber 32, and reacting the HF with native oxide on substrate surface 12. Alternatively, the surface cleaning reaction can be performed by a plasma reaction in which the HF gas is energized in an RF field.

After substrate surface 12 is cleaned, substrate 10 is transferred to process chamber 34. In process chamber 34, $N_2O$ is introduced from gas supply 24 through mass flow controller 44 and master valve 40. The temperature in chamber 34 is controlled by temperature controller 52 within a range of preferably 900° to 1150° C., and most preferably, at 950° C. In a preferred embodiment, once first oxynitride layer 14 is formed, oxygen is introduced into chamber 34 from gas supply 26 through mass flow controller 46 and master valve 40, and $SiO_2$ layer 16 is grown on substrate surface 12. After the oxidation step, $N_2O$ is again supplied from gas supply 24, and second oxynitride layer 18 is formed on substrate surface 12.

Alternatively, the process can be performed in separate processing chamber in processing apparatus 20. In the alternative embodiment, substrate 10 is transferred to processing chamber 36. In chamber 36, oxygen is introduced from gas supply 26 through mass flow controller 46 and master valve 40, and $SiO_2$ layer 16 is grown on substrate surface 12. After the oxidation step, substrate 10 is transferred to processing chamber 38. There $N_2O$ is supplied from gas supply 24, and second oxynitride layer 18 is formed on substrate surface 12.

Those skilled in the art will appreciate that, in a like manner, other layers may also be formed in process apparatus 20, and additional cleaning steps can also be carried out. An important advantage of performing the processing steps in a processing apparatus such as apparatus 20, is achieved by excluding room-ambient atmosphere from substrate 20 between the various stages of processing. Each processing chamber in apparatus 20, as well as the transfer means, are constantly purged by an inert carrier gas supplied from gas supply 22. The presence of the inert carrier gas throughout apparatus 20, prevents native oxide materials from growing on any exposed surface of substrate 10 during the sequential processing steps.

Although the processing steps have been described with respect to a preferred embodiment, which can be carried out in an apparatus such as apparatus 20, different methods can be used to form the composite dielectric layer of the invention. For example, conventional, independent reactors can be used to perform each step independently. In this case, precleaning processing steps are necessary to ensure removal of native oxides prior to the formation of the oxynitride layers and the $SiO_2$ layer.

Figure 3:
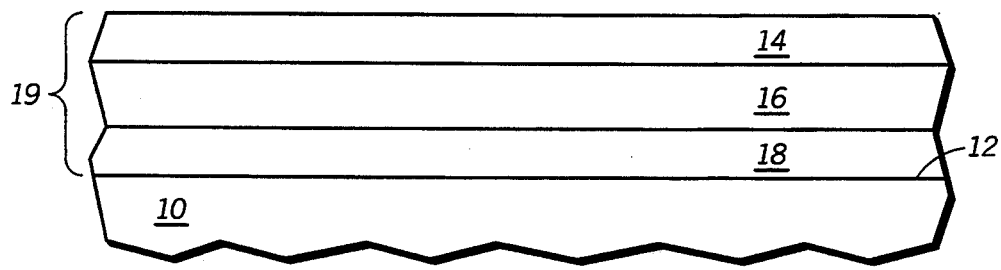
Figures 1, 6:
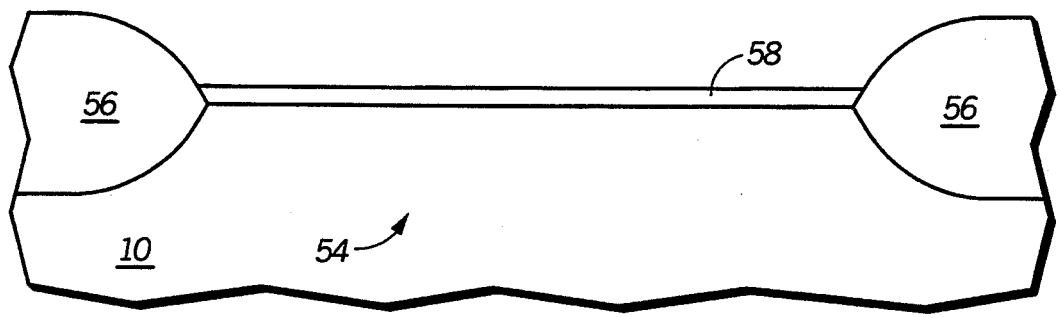
Figures 2, 6:
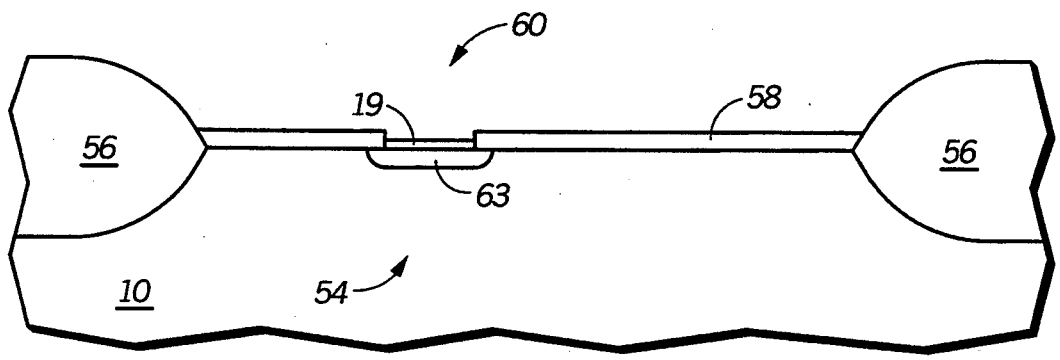
Figures 3, 6:
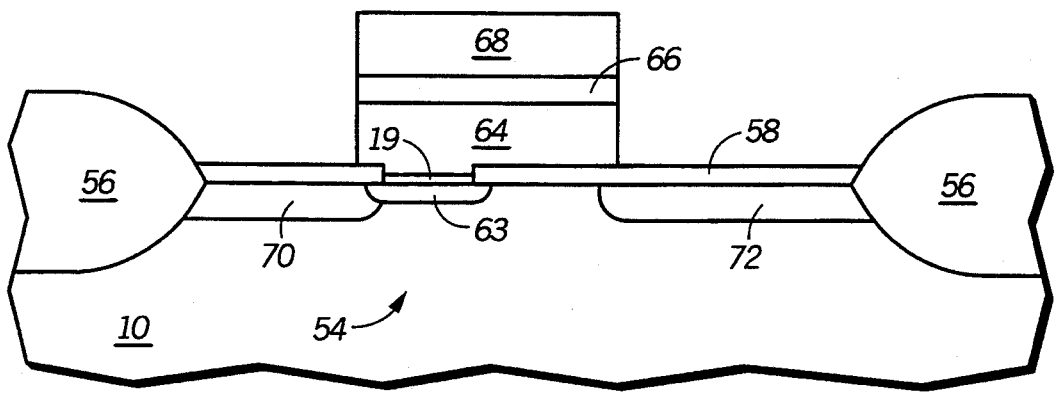

FIGS. 6-1 through 6-3, illustrate the application of the invention to the fabrication of an EEPROM device. Only those process steps necessary for explaining the invention are illustrated and described. The process, of course, may include other steps which are necessary for the fabrication of a complete device, but which do not involve the invention. To avoid confusion, these steps, which are conventionally used in semiconductor processing, have not been shown.

FIG. 6-1 illustrates, in cross-section, a portion of semiconductor substrate 10 having already undergone several process steps in accordance with the invention. In substrate 10, an active region 54 is defined by a field oxide region 56, which is formed in the surface of substrate 10. A gate dielectric layer 58 overlies the surface of active region 54. Dielectric layer 58 is preferably formed by thermal oxidation of substrate surface 12 using dry oxygen gas. The oxidation process is carried out at a temperature of about 925° to 975° C. and preferably at 950° C. During the oxidation process, the temperature is ramped-up to about 1,050° C. and an intermediate argon annealing step is performed. Alternatively, gate dielectric layer 58 can be a dielectric material other than $SiO_2$, such as chemical vapor deposited silicon nitride, silicon oxynitride, and the like.

Following the formation of gate dielectric layer 58, a photolithographic pattern is formed on substrate 10, and ion implantation step is carried out to form tunnel region 63 in substrate 10. After forming tunnel region 63, an etching process is performed to etch an opening 60 in a portion of gate dielectric layer 58 overlying tunnel region 63. In one method, the same photolithographic pattern used to define tunnel region 63 can also be used to provide an etch mask for the formation of opening 60. Alternatively, other processing techniques can be employed to form both tunnel region 63 and opening 60. For example, separate photolithographic masking layers can be used for the formation of opening 60 and tunnel region 63. Once opening 60 is defined in gate dielectric layer 58, composite dielectric layer 19 is formed on the portion of substrate surface 12 which is exposed by opening 60. The same processing steps as those illustrated in FIGS. 1-3 and previously described are employed to form composite dielectric layer 19 in opening 60.

The process is continued, as illustrated in FIG. 6-3, by forming a stacked-gate electrode 61 overlying composite dielectric layer 19, and portion of gate dielectric layer 58. Stacked-gate electrode 61 includes a floating gate electrode 64, and inter-gate dielectric layer 66, and a control gate 68. In one method, stacked-gate electrode 61 is formed by sequentially depositing a first polycrystalline silicon layer, a dielectric layer, and a second polycrystalline silicon layer. A photolithographic mask is defined on the second polysilicon layer and the polysilicon layers, and the intermediate gate dielectric layer are sequentially etched. Preferably, an anisotropic etching process is used to form stacked-gate electrode 61.

Those skilled in the art will recognize stacked-gate electrode 61 as a common element of an EEPROM device. Preferably, inter-gate dielectric layer 66 is formed by a combination of oxidation and silicon nitride deposition steps. These steps are carried out to fabricate an oxide-nitride-oxide (ONO) inter-gate dielectric layer. The polycrystalline silicon material used to form both floating gate electrode 64 and control gate electrode 68 is doped with a conductivity determining dopant. The doping process is performed either during the deposition cycle, or immediately following deposition of the polycrystalline silicon. In the case of an N-type MOS (NMOS) device, gate electrodes 64 and 68 are doped with an N-type dopant, such as phosphorus, arsenic, antimony, and the like. After defining stacked-gate electrode 61, source and drain regions 72 and 70, respectively, are formed in substrate 10 by ion implantation using stack gate electrode 61 as a doping mask.

As employed in the embodiment of the invention illustrated in FIG. 6-3, composite dielectric layer 19 functions as a tunnel gate dielectric material in an EEPROM device. The nitrogen accumulation characteristics of composite dielectric layer 19 provide a region of high nitrogen concentration at the interface between floating gate electrodes 64 and composite dielectric layer 19. Additionally, a region of high nitrogen concentration also occurs at the interface between composite dielectric layer 19 and substrate surface 12. The presence of regions of high nitrogen concentration at the interfaces, functions to enhance the durability of composite layer 19 as a tunnel dielectric material during successive program and erase cycles commonly used to store information in EEPROM devices. The nitrogen rich regions of composite dielectric layer 19 reduce the formation of electron traps during Fowler-Nordheim tunneling at the programming and erasing stages. Thus, the presence of composite dielectric layer 19, formed in accordance with the invention, substantially increases the useful lifetime of a FETMOS EEPROM device.

Although the foregoing illustrative embodiment describes the use of composite dielectric layer 19 as a tunneling dielectric material, the advantages obtained by the use of composite dielectric layer 19 can be applied to other devices. For example, composite dielectric layer 19 can be used as a capacitor dielectric in a thin-film capacitor.

Thus it is apparent that there has been provided, in accordance with the invention, a process for fabricating a semiconductor device having a high reliability dielectric material which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, the high-reliability dielectric layer can be integrated into VLSI MOS transistors having lightly-doped drain structures. Further, the dielectric layer can be used in P-type MOS (PMOS) devices. It is therefore intended to include within the invention all such variations and modifications as fall within the scope of the appended claims and equivalents thereof.

We claim:

1. A process for fabricating a semiconductor device comprising the steps of:
   providing a silicon substrate having a surface;
   forming a first oxynitride layer on the substrate;
   oxidizing the substrate surface to form an oxide layer underlying the first oxynitride layer; and
   exposing the substrate to nitrous oxide and diffusing a nitrogen bearing species through the first oxynitride layer and the oxide layer to form a second oxynitride layer underlying the oxide layer.

2. The process of claim 1, wherein the step of exposing the substrate to nitrous oxide comprises thermal diffusion at a temperature of 900° C. to 1150° C.

3. The process of claim 1 further comprising precleaning the silicon substrate to remove native oxide prior to forming the first oxynitride layer.

4. The process of claim 1, wherein the step of forming a first oxynitride layer comprises forming oxynitride in a thermally-controlled reactor using nitrous oxide at a temperature of 900° C. to 1150° C.

5. The process of claim 1 further comprising depositing a layer of polycrystalline silicon on the first oxynitride layer.

6. The process of claim 1, wherein diffusing a nitrogen bearing species comprises diffusing a nitrogen species selected from the group consisting of nitrous oxide, nitric oxide, and nitrogen dioxide.

7. A process for fabricating a semiconductor device comprising the steps of:
   placing a silicon substrate having a surface in a thermally-controlled reactor;
   flowing hydrogen fluoride gas to remove native oxides from the substrate surface;
   flowing nitrous oxide gas to form a first oxynitride layer on the substrate;
   flowing oxygen gas and oxidizing the substrate surface to form a silicon oxide layer on the substrate; and
   flowing nitrous oxide gas and diffusing a nitrogen bearing species through the first oxynitride layer and the oxide layer form a second oxynitride layer underlying the silicon oxide layer.

8. The process of claim 7, wherein the process steps are sequentially performed without exposing the substrate to room ambient.

9. The process of claim 7, wherein the substrate is heated to a temperature of 900° C. to 1150° C. prior to forming the first oxynitride layer.

10. The process of claim 7, wherein the nitrous oxide flow rate is 4 to 14 standard liters per minute.

11. The process of claim 7, wherein diffusing a nitrogen bearing species comprises diffusing a nitrogen species selected from the group consisting of nitrous oxide, nitric oxide, and nitrogen dioxide.

12. A process for fabricating a semiconductor device comprising the steps of:
   providing a semiconductor substrate having an active region defined by a field oxide region;
   forming a gate oxide layer overlying the active region;
   etching away a portion of the gate oxide layer to expose a portion of the substrate;
   forming a first oxynitride layer on the exposed portion of the substrate;
   oxidizing the exposed portion of the substrate to form an oxide layer underlying the first oxynitride layer;
   diffusing a nitrogen bearing species through the first oxynitride layer and the oxide layer to form a second oxynitride layer underlying the oxide layer; and forming a gate electrode overlying the first oxynitride layer and a portion of the gate oxide layer.

13. The process of claim 12, wherein the step of diffusing nitrous oxide comprises thermal diffusion at a temperature of 900° C. to 1150° C.

14. The process of claim 12 further comprising pre-cleaning exposed portion of the silicon substrate to remove native oxide prior to forming the first oxynitride layer.

15. The process of claim 12, wherein the step of forming a first oxynitride layer comprises chemical vapor deposition using nitrous oxide source gas at a temperature of 900° C. to 1150° C.

16. The process of claim 12, wherein diffusing a nitrogen bearing species comprises diffusing a nitrogen species selected from the group consisting of nitrous oxide, nitric oxide, and nitrogen dioxide.

* * * * *